US007265423B2

(12) United States Patent
Mokhlesi et al.

(10) Patent No.: US 7,265,423 B2
(45) Date of Patent: Sep. 4, 2007

(54) TECHNIQUE FOR FABRICATING LOGIC ELEMENTS USING MULTIPLE GATE LAYERS

(75) Inventors: Nima Mokhlesi, Los Gatos, CA (US); Jeffrey Lutze, San Jose, CA (US)

(73) Assignee: SanDisk Corporation, Sunnyvale, CA (US)

( * ) Notice: Subject to any disclaimer, the term of this patent is extended or adjusted under 35 U.S.C. 154(b) by 0 days.

(21) Appl. No.: 11/435,456

(22) Filed: May 16, 2006

(65) Prior Publication Data

US 2006/0202258 A1 Sep. 14, 2006

Related U.S. Application Data

(62) Division of application No. 10/211,433, filed on Aug. 2, 2002, now Pat. No. 7,064,034.

(60) Provisional application No. 60/421,115, filed on Jul. 2, 2002.

(51) Int. Cl.
H01L 29/76 (2006.01)
(52) U.S. Cl. .............................. 257/366; 257/E21.623
(58) Field of Classification Search ................ 257/213, 257/341, 351, 365, 366, 250, 288, 401, E21.623; 438/277, 279, 283, E21.637, 157, 176, 282
See application file for complete search history.

(56) References Cited

U.S. PATENT DOCUMENTS

| 3,436,623 | A | | 4/1969 | Beer |
| 4,300,279 | A | | 11/1981 | Wieder |
| 4,380,863 | A | * | 4/1983 | Rao ........................... 438/279 |
| 4,409,723 | A | | 10/1983 | Harari |
| 4,749,443 | A | | 6/1988 | Mitchell et al. |
| 5,045,488 | A | | 9/1991 | Yeh |
| 5,210,047 | A | | 5/1993 | Woo et al. |
| 5,239,196 | A | | 8/1993 | Ikeda et al. |
| 5,296,393 | A | | 3/1994 | Smayling et al. |
| 5,455,184 | A | * | 10/1995 | Tigelaar ..................... 438/257 |
| 5,504,451 | A | | 4/1996 | Smayling et al. |
| 5,569,962 | A | | 10/1996 | Yang |
| 5,598,020 | A | * | 1/1997 | Matsuo ....................... 257/401 |
| 5,851,881 | A | | 12/1998 | Lin et al. |
| 5,953,599 | A | | 9/1999 | El-Diwany |
| 6,133,102 | A | | 10/2000 | Wu |
| 6,166,410 | A | | 12/2000 | Lin et al. |
| 6,260,177 | B1 | | 7/2001 | Lee et al. |
| 6,313,500 | B1 | | 11/2001 | Kelley et al. |
| 6,323,103 | B1 | | 11/2001 | Rengarajan et al. |

FOREIGN PATENT DOCUMENTS

DE 1 564 222 12/1966

OTHER PUBLICATIONS http://en.wikipedia.org/wiki/Logic_gate.*

(Continued)

*Primary Examiner*—Brook Kebede
(74) *Attorney, Agent, or Firm*—Dean E. Wolf; Beyer Weaver, LLP

(57) ABSTRACT

Various techniques are described which utilize multiple poly-silicon layers in the design and fabrication of various logic elements that are used in semiconductor devices. According to a specific implementation of the present invention, logic gate cell sizes and memory array cell sizes may be reduced by fabricating various transistor gates using multiple poly-silicon layers. The techniques of the present invention of using multiple layers of poly-silicon to form transistor gates of logic elements provides extra degrees of freedom in fine tuning transistor parameters such as, for example, oxide thickness, threshold voltage, maximum allowed gate voltage, etc.

35 Claims, 13 Drawing Sheets

OTHER PUBLICATIONS

R. Stewart et al., "Stream Control Transmission Protocol," Network Working Group, RFC: 2960, 134 Pages, Oct. 2000.

Wett et al, "Flash—The Memory Technology of the Future That's Here Today," IEEE, pp. 359-364. 1995.

http://en.wikipedia.org/wiki/Logic_gate , downloaded from the internet in the version last modified Jan. 3, 2005, 5 pp.

International Search Report, dated Nov. 3, 2003 from related International Application No. PCT/US 03/20453, 6 pp. including Notification of Transmittal (SDK1P010.WO).

* cited by examiner

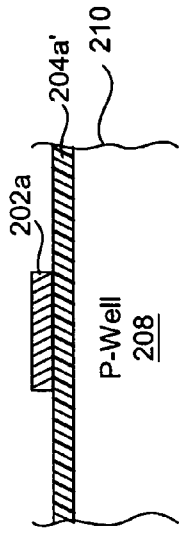
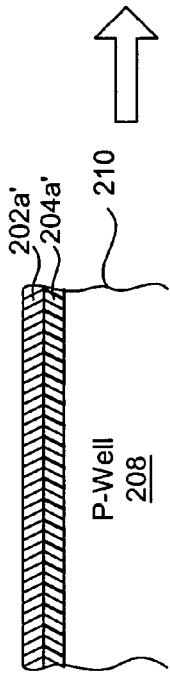
FIG. 2B
FIG. 2C
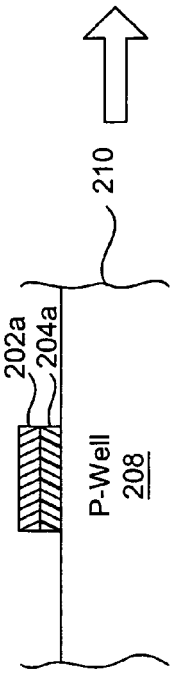
FIG. 2D
FIG. 2E
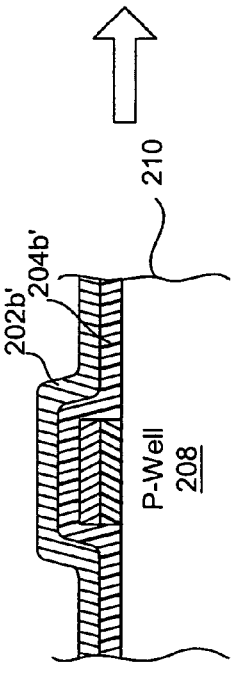
FIG. 2F
FIG. 2G
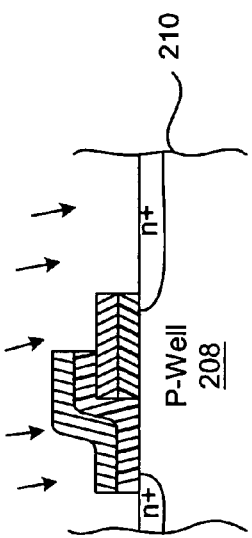
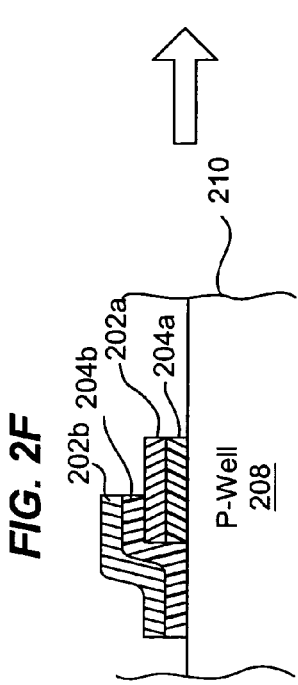
FIG. 2H
FIG. 2I

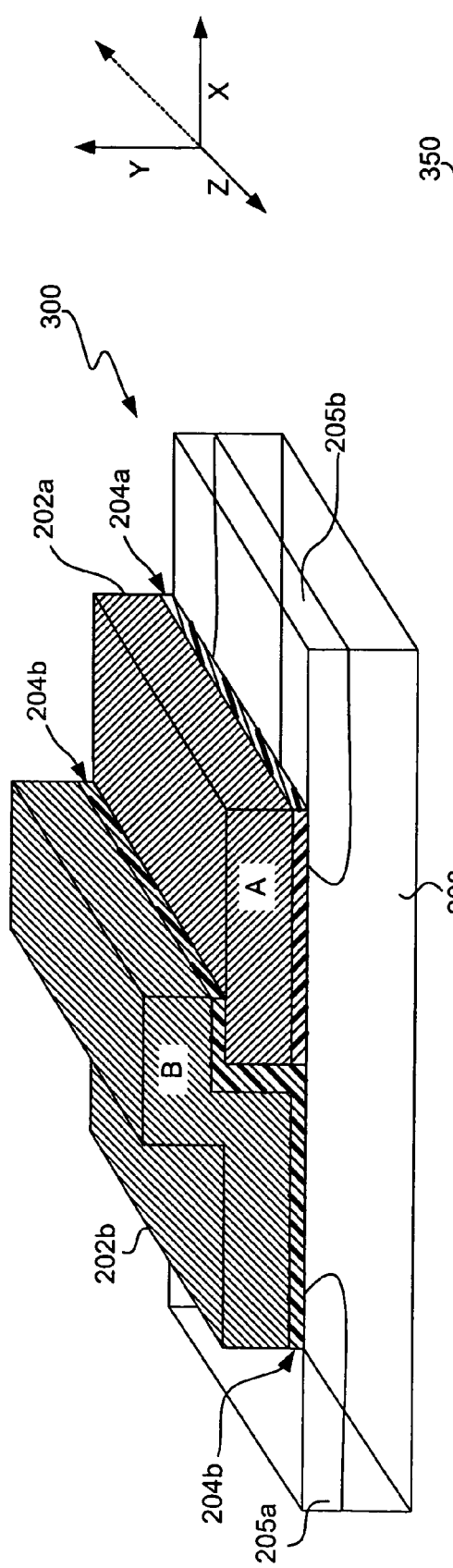
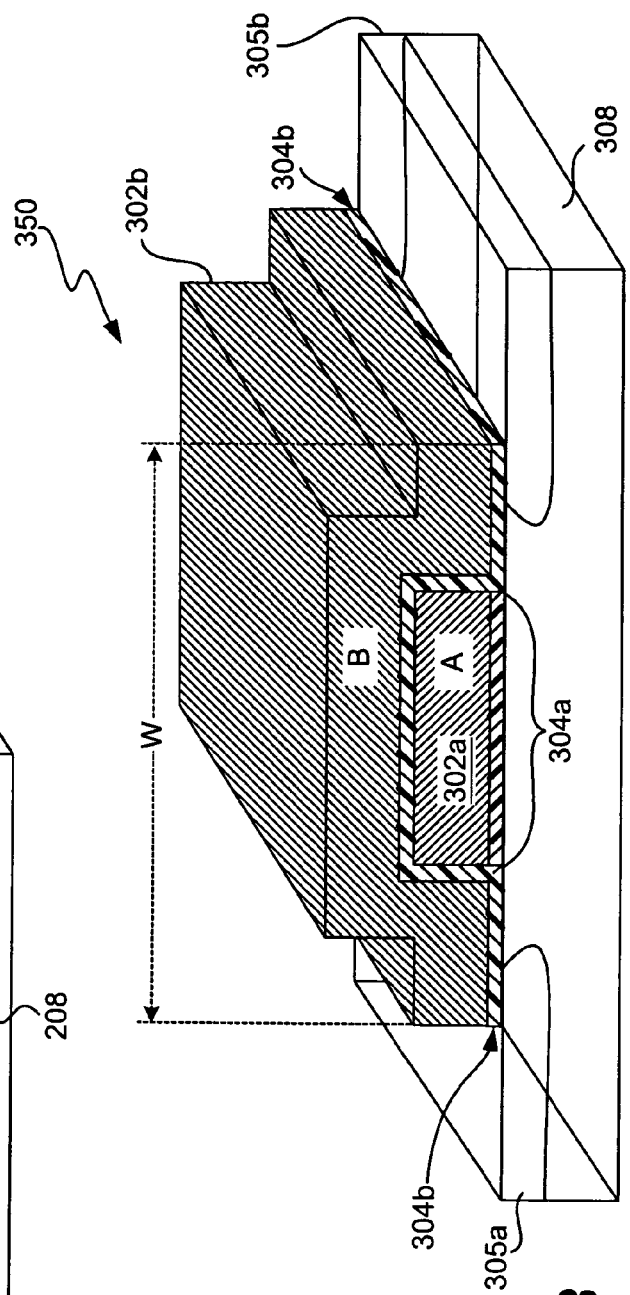
FIG. 3A
FIG. 3B

TECHNIQUE FOR FABRICATING LOGIC ELEMENTS USING MULTIPLE GATE LAYERS

CROSS REFERENCE TO RELATED APPLICATION

This application is a divisional application, pursuant to the provisions of 35 U.S.C. 120, of prior U.S. patent application Ser. No. 10/211,433 entitled "TECHNIQUE FOR FABRICATING LOCIC ELEMENTS USING MULTIPLE GATE LAYERS" by Mokhlesi et al., filed on Aug. 2, 2002 now U.S. Pat. No. 7,064,034, which claims benefit, pursuant to the provisions of 35 U.S.C. 119, of priority from U.S. patent application No. 60/421,115, filed Jul. 2, 2002, and entitled "TECHNIQUE FOR FABRICATING LOCIC ELEMENTS USING MULTIPLE GATE LAYERS." Each of these applications is incorporated herein by reference in its entirety and for all purposes.

BACKGROUND OF THE INVENTION

The present invention relates generally to integrated circuit chip fabrication, and more specifically to a technique for fabricating logical elements using a multiple gate layer technique.

The fabrication of an integrated circuit typically involves a variety of steps including a design phase, multiple simulation phases, and a fabrication phase. During the design phase, the various logical components of the integrated circuit (IC) are incorporated into a unified design layout, typically with the help of integrated circuit design software. Thereafter, during a simulation phase, the integrated circuit design is tested using conventional circuit simulation software such as, for example, spice parameter extraction software. Examples of spice parameter extraction software include BSIMPRO (licensed by Celestry Design Technologies, Inc., of San Jose, Calif.), and Aurora (licensed by Synopsys, Inc., of Mountain View, Calif.). During the fabrication stage of the integrated circuit, a variety of IC structures may be formed on a silicon wafer by forming layers on and removing various layered regions from the silicon wafer.

Generally, it is desirable to reduce the costs and expenses associated with integrated circuit (IC) chip fabrication. A conventional technique for reducing IC chip fabrication costs involves reducing the number of deposition and etching steps which are performed during the IC chip fabrication process. For this reason, it is the conventional practice in the industry to fabricate integrated circuits using only a single layer of deposited poly-silicon. Such a technique provides for a relatively less complex and cheaper fabrication process. In fact, the use of a single poly-silicon layer in the fabrication of logic elements (which form part of an integrated circuit) is so widely accepted that most conventional circuit simulation software currently available on the market are primarily designed to be compatible with standardized layout and fabrication techniques which use a single poly-silicon layer.

Examples of a portion of a conventional integrated circuit design are illustrated in FIGS. 1A-C of the drawings. FIG. 1A shows a schematic diagram of a circuit 100 which includes two transistors that are connected in series (herein referred to as "series transistor circuit"). When incorporated as part of an integrated circuit using conventional IC fabrication techniques, the series transistor circuit 100 of FIG. 1A may be fabricated as illustrated in FIG. 1B. As illustrated in FIG. 1B, the circuit portion 150 includes two serially connected transistors which have been fabricated using a single poly-silicon layer. More specifically, as shown in FIG. 1B, the circuit portion 150 includes two gate portions 102a, 102b which have both been fabricated using a single poly-silicon layer. Additionally, circuit portion 150 also includes two oxide layer portions 104a, 104b, which have both been fabricated using a single oxide layer. The circuit portion 150 further includes a substrate 110 (e.g., silicon substrate), which includes three doped regions 105a, 105b, 105c formed within a doped well region 108. In the example of FIG. 1B, the circuit portion 150 has been configured as two serially connected NMOS transistors, which include P-well region 108, and $N^+$ doped regions 105a-c. Such a circuit may be used, for example, in the formation of a variety of conventional logic elements such as NOR gates, NAND gates, etc.

FIG. 1C shows an example of a conventional IC design layout 170 of the series transistor circuit 100 of FIG. 1A. As illustrated in FIG. 1C, the conventional technique for fabricating the series transistor circuit 100 is performed using a single poly-silicon layering technique, wherein gates 102a and 102b are formed over an active region 115 of the transistor circuit. Each of the gates 102a, 102b is formed from the same poly-silicon layer. Using conventional terminology, gates 102a and 102b may each be described as being composed of "poly1" material since each of these gates are formed from the same first layer of deposited poly-silicon (i.e., poly-1). According to conventional design rules, each of the gates 102a and 102b are required to be separated by a minimum distance 117 in order to ensure proper operation of the fabricated circuit.

While the use of a single poly-silicon layer conforms with standardized IC layout and fabrication techniques, such standardized techniques necessitate specific design and layout requirements which may result in an inefficient utilization of space on the silicon wafer or substrate. Accordingly, it will be appreciated that there exists a continual need to improve upon integrated circuit chip fabrication techniques in order to accommodate and take advantage of new and emerging technologies.

SUMMARY OF THE INVENTION

Various embodiments of the present invention are directed to a circuit portion of a logic element which is part of an integrated circuit fabricated on a substrate. In at least one implementation, the logic element is operable to perform at least one logic operation. In at least one implementation, the circuit portion includes: a first doped region formed in the substrate which functions as a source region of the circuit portion; a second doped region formed in the substrate which functions as a drain region of the circuit portion; and an active region formed in the substrate between said source and drain regions, wherein active region is adapted to enable current flow between said source and drain regions. In at least one implementation, the circuit portion may also include: a first gate formed over a first portion of the active region, wherein the first gate is adapted to control a first active channel of current flow between the source and drain regions; and a second gate formed over a second portion of the active region, wherein the second gate is adapted to control a second active channel of current flow between the source and drain regions. Further, according to specific embodiments, the circuit portion is adapted to exhibit performance characteristics substantially similar to performance characteristics of at least two transistors connected in parallel.

According to a specific embodiments the circuit portion may include a single source region and a single drain region, and the active region may include the first active channel and second active channel. Further, according to specific embodiments, the logic element may be adapted to implement logic functionality relating to a variety of different logic elements such as, for example: NAND gates, AND gates, NOR gates, OR gates, XOR gates, SRAM cells, and latches.

Other embodiments of the present invention are directed to a logic element of an integrated circuit fabricated on a substrate. In at least one implementation, the logic element is operable to perform at least one logic operation and includes a first circuit portion adapted to exhibit performance characteristics substantially similar to performance characteristics of at least two transistors connected in parallel. According to specific embodiments, the first circuit portion includes: a first doped region formed in the substrate which functions as a source region of the circuit portion; a second doped region formed in the substrate which functions as a drain region of the circuit portion; and an active region formed in the substrate between said source and drain regions, wherein active region is adapted to enable current flow between said source and drain regions. The first circuit portion may also include a first gate formed over a first portion of the active region. The first gate may be adapted to control a first active channel of current flow between the source and drain regions. The first circuit portion may also include a second gate formed over a second portion of the active region. The second gate may be adapted to control a second active channel of current flow between the source and drain regions.

According to a specific embodiments the circuit portion may include a single source region and a single drain region, and the active region may include the first active channel and second active channel. Further, according to specific embodiments, the logic element may be adapted to implement logic functionality relating to a variety of different logic elements such as, for example: NAND gates, AND gates, NOR gates, OR gates, XOR gates, SRAM cells, and latches. Additionally, in at least one embodiment, the logic element may include a second circuit portion adapted to exhibit performance characteristics substantially similar to performance characteristics of at least two transistors connected in series.

It will be appreciated that the various techniques of the present invention for using multiple layers of poly-silicon to form transistor gates of logic elements provides extra degrees of freedom in fine tuning transistor parameters such as, for example, oxide thickness, threshold voltage, maximum allowed gate voltage, etc.

Additional objects, features and advantages of the various aspects of the present invention will become apparent from the following description of its preferred embodiments, which description should be taken in conjunction with the accompanying drawings.

BRIEF DESCRIPTION OF THE DRAWINGS

FIGS. 2B-2J illustrate one technique for fabricating a logic element in accordance with a specific embodiment of the present invention.

FIGS. 3A-D illustrate different embodiments of a series transistor circuit which may be fabricated in accordance with the techniques of the present invention.

DETAILED DESCRIPTION OF THE PREFERRED EMBODIMENTS

Figure 1C:
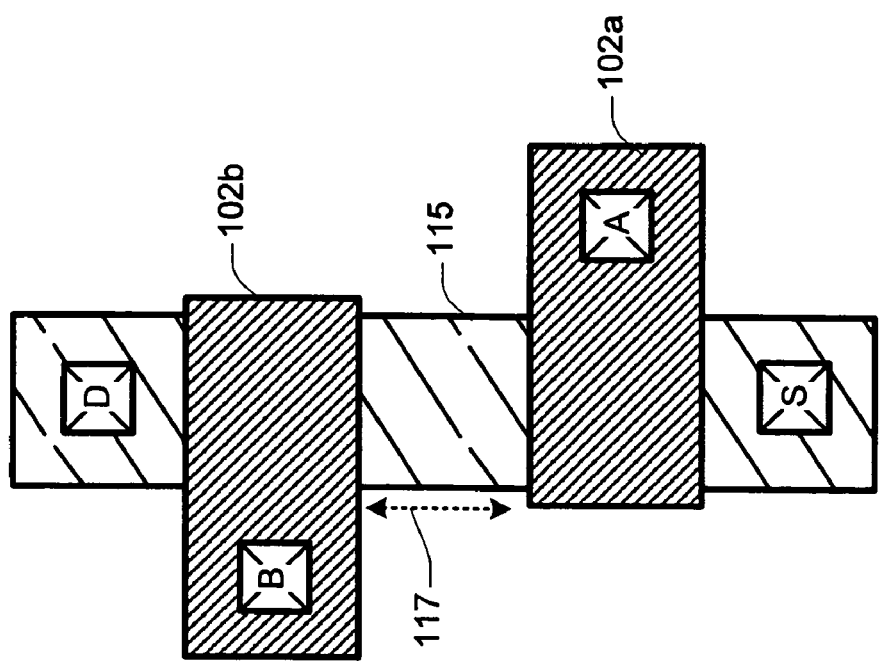
FIGS. 1A-C show examples of conventional integrated circuit design and fabrication techniques for a series transistor circuit.

The present invention describes various techniques which utilize multiple poly-silicon layers in the design and fabrication of various logic elements (e.g., NAND gates, AND gates, NOR gates, OR gates, XOR gates, SRAM cells, latches, etc.) that are used in semiconductor devices. According to a specific implementation of the present invention, logic gate cell sizes and memory array cell sizes may be reduced by fabricating various transistor gates using multiple poly-silicon layers. In this way, area reduction of the integrated circuit chip may be achieved by reducing the standardized design rules corresponding to minimum poly-1 to poly-1 spacing. Thus, for example, the technique of the present invention may allow for the layout and/or design of overlapping poly-silicon pieces which do not short to one another because the different poly-silicon pieces may be formed using a multi-layer poly-silicon fabrication technique. According to a specific embodiment, such overlapping pieces may be composed of at least two different poly-silicon layers which are vertically separated by at least one insulating layer such as, for example, an oxide layer. In this way, electrical shorting of the overlapping poly-silicon pieces may be prevented. Moreover, the technique of the present invention of using multiple layers of poly-silicon to form transistor gates of logic elements provides extra degrees of freedom in fine tuning transistor parameters such as, for example, oxide thickness, threshold voltage, maximum allowed gate voltage, etc.

As noted previously, conventional wisdom teaches the desirability to reduce or minimize the cost associated with fabricating integrated circuits. Typically, one technique for reducing or minimizing such costs is to minimize the number of poly-silicon layers which are used to form the logic elements of an integrated circuit. More recently, fabrication techniques used for fabricating certain types of memory such as, for example, flash memory, utilize a double poly-silicon layer process whereby different layers of poly-silicon are deposited onto the silicon wafer at different times in order to form the control gates and floating gates of the flash memory cells. In specific applications where an integrated circuit chip design is to include both flash memory and conventional logic elements, fabrication of the integrated circuit chip may involve a double poly-silicon layering process in order, for example, to form the flash memory cells. However, during fabrication of such integrated circuits, it remains the conventional practice to fabricate the logic elements of the integrated circuit using a single poly-silicon layer. One reason why it is desirable to design and fabricate the logic elements of an integrated circuit using a single poly-silicon layer (even in situations where the integrated circuit includes flash memory) is because single poly layer circuits are more simplistic in design and therefore are typically easier to fabricate, and are less subject to fabrication errors. Additionally, as noted previously, most conventional circuit simulation software currently available on the market are designed only to be compatible with standardized layout and fabrication techniques which use a single poly-silicon layer. Such circuit simulation software is typically not compatible with multi-poly-silicon layer designs.

Contrary to conventional wisdom and practice, however, the present invention teaches the desirability to fabricate logic elements using multiple poly-silicon layers, particularly in applications where memory elements (e.g., flash memory, DRAM) and logic elements are to be fabricated on the same integrated circuit chip. In such applications, one is able to take advantage of the multiple poly-layer process (e.g., used for fabricating the memory elements) by designing logic elements which also utilize multiple poly-layers.

Figure 1A:
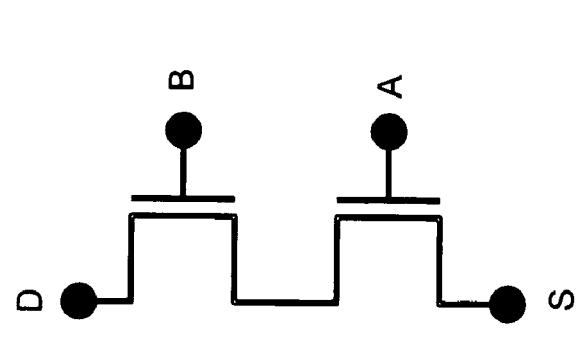
Figure 2A:
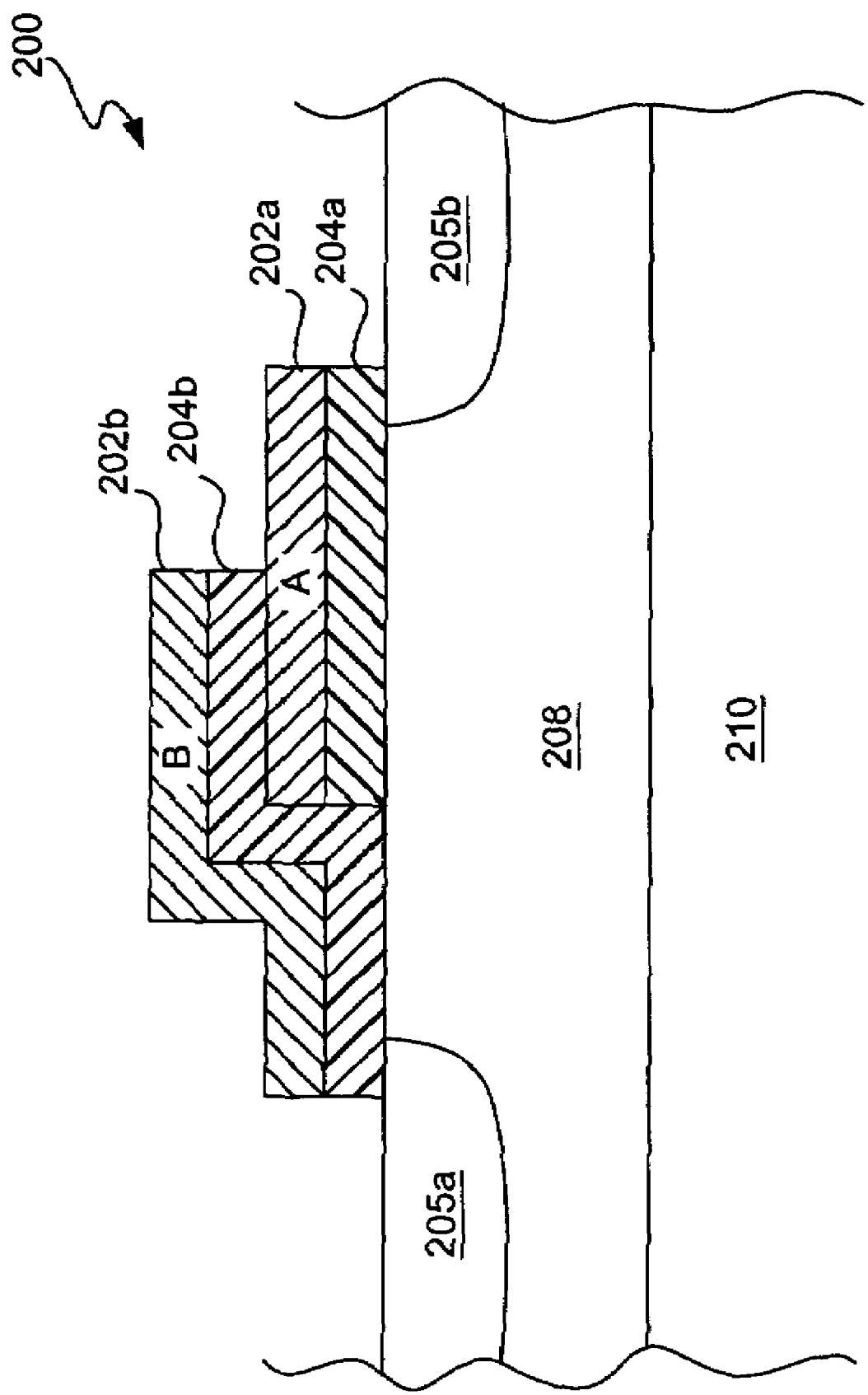
FIG. 2A shows a portion 200 of a logic element which has been fabricated in accordance with a specific embodiment of the present invention.

FIG. 2A shows a portion 200 of a logic element which has been fabricated in accordance with a specific embodiment of the present invention. More specifically, the circuit portion 200 illustrated in FIG. 2A is an example of how a series transistor circuit (such as that shown in FIG. 1A) may be fabricated in accordance with a specific embodiment present invention. According to specific embodiments, the circuit portion 200 may be used in the fabrication a variety of logic elements such as, for example, NAND gates, AND gates, NOR gates, OR gates, XOR gates, SRAM cells, latches, etc.

A specific embodiment for fabricating the circuit portion 200 is illustrated in FIGS. 2B-2I of the drawings. FIGS. 2B-2I illustrate one technique for fabricating a logic element in accordance with a specific embodiment of the present invention. In the example illustrated in FIGS. 2B-2I, it is assumed that a silicon wafer is being used for the fabrication of an integrated circuit chip. In preparation for the IC chip fabrication process, portions of the silicon wafer may be doped with an p-type material, thereby forming a P-well 208.

As shown in FIG. 2B, a first oxide layer 204a' is formed on the surface of the silicon wafer 210. After formation of the first oxide layer 204a', a first poly-silicon (poly-1) layer 202a' may be deposited over the first oxide layer. Regions of the poly-1 layer 202a' may then be removed or etched to thereby form first poly-silicon layer portion 202a, as illustrated in FIG. 2C. After formation of the first poly-silicon layer portion 202a, regions of a first oxide layer 204a' may be removed to thereby form a first oxide layer portion 204a as illustrated in FIG. 2D. According to a specific embodiment, the formation and/or removal of the poly-silicon layers and oxide layers may be achieved using conventional IC chip fabrication techniques commonly known to one having ordinary skill in the art.

As illustrated in FIGS. 2E and 2F, a second oxide layer 204b' and a second poly-silicon (poly-2) layer 202b' may then be formed and/or deposited over portions of the silicon wafer, including, portions 202a and 204a. As shown in FIG. 2G, regions of the poly-2 layer may be removed to thereby form second poly-silicon layer portion 202b. Thereafter, selected regions of the second oxide layer may be removed to thereby form second oxide layer portion 204b as illustrated in FIG. 2H. As illustrated in FIG. 2I, doped regions 205a and 205b may then be formed, for example, using conventional ion implementation techniques. According to specific embodiments, the doped regions 205a and 205b may be doped with an n-type material such as, for example, arsenic. Alternatively, region 208 may be doped with an n-type material, thereby forming an N-well, and regions 205a and 205b may be doped with a p-type material.

Figure 2J:
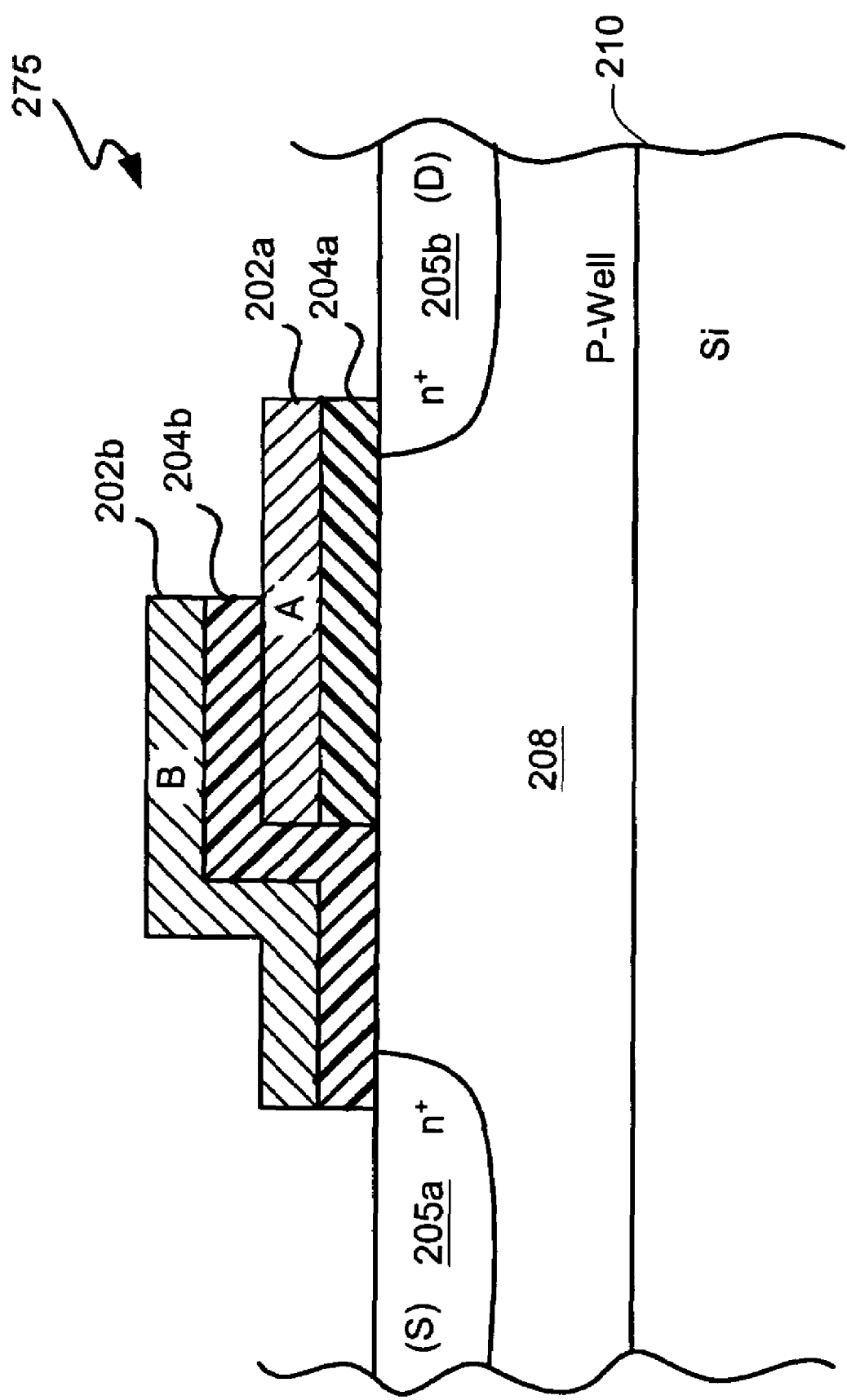

When implemented as two serially connected NMOS transistors, the circuit portion 200 will correspond to the circuit portion 275 of FIG. 2J, which may be schematically represented by the schematic diagram 100 of FIG. 1A. As shown in FIG. 2J, the two gates (e.g., gate B 202b and gate A 202a) of the series transistor circuit 275 are used to control the flow of current from source 205a to drain 205b.

Figure 1B:
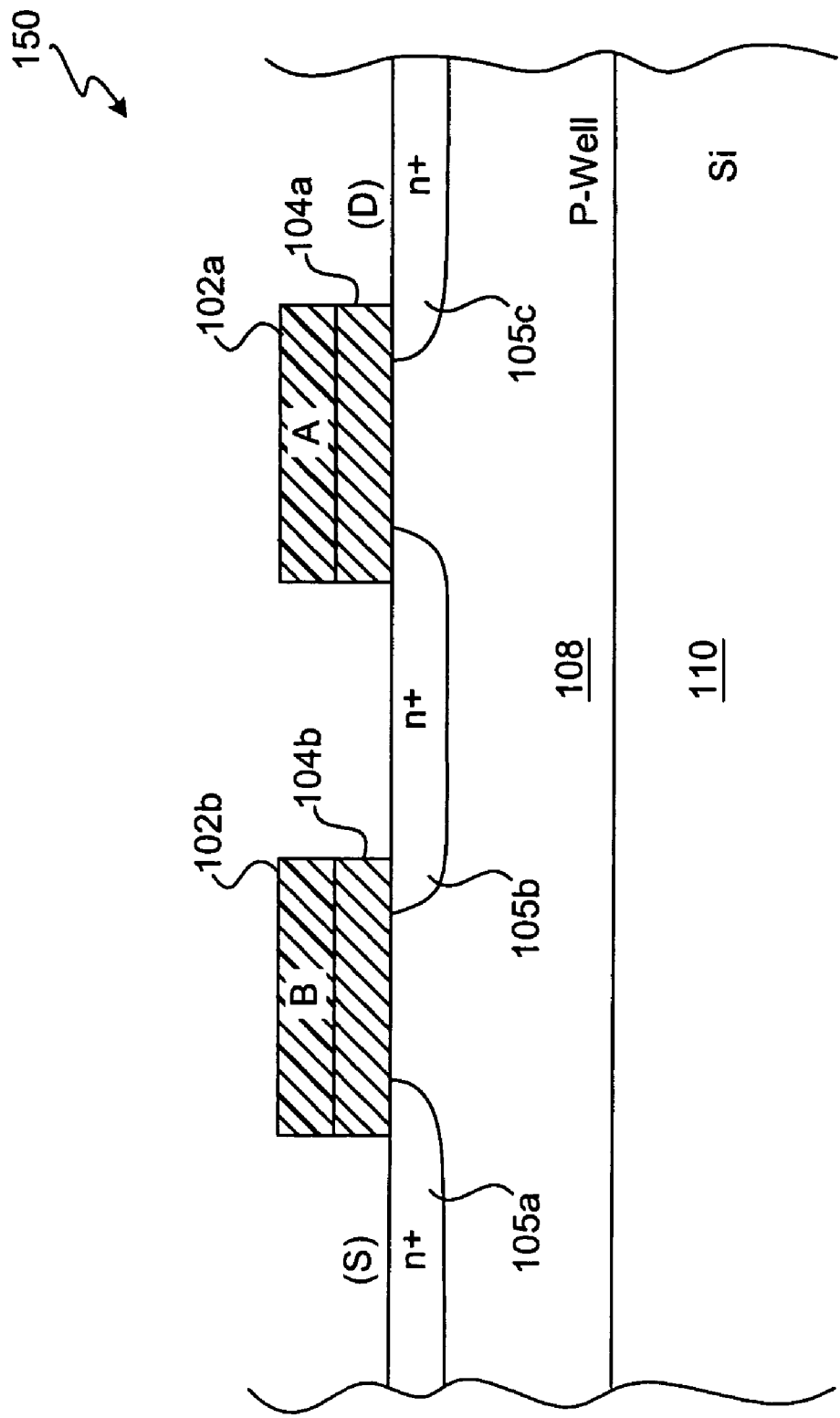

A comparison between circuit portion 150 of FIG. 1B (which represents a serial transistor circuit fabricated using conventional techniques) and circuit portion 275 of FIG. 2J reveals a number of differences. For example, the distance separating gate A and gate B is much smaller in FIG. 2J as compared to FIG. 1B. More specifically, as illustrated in FIG. 2J, the distance separating gate 202b and gate 202a is approximately equal to the thickness of the second oxide layer portion 204b. Additionally, as illustrated in FIG. 2J, the poly-2 layer portion 204b is positioned in a continuous manner both over and adjacent to the poly-1 layer portion 202a and first oxide layer portion 204a. The poly-2 layer portion 202b also overlaps with a region of the poly-1 layer portion 202a. According to different embodiments, this amount of overlap may vary within a range of 0% of overlap (e.g., abutting gate regions) to about 100% overlap (e.g., completely overlapping gate regions).

Further, as illustrated in FIG. 2J, an entire doped region has been eliminated from the silicon substrate, as compared to FIG. 1B. For example, as illustrated in FIG. 2J, the circuit portion 275 includes two $N^+$ doped regions 205a, 205b. In contrast, the circuit portion 150 of FIG. 1B includes 3 $N^+$ doped regions, namely 105a, 105b, and 105c. A comparison of FIGS. 1B and 2J reveals that the doped region 105b which exists between gate A and gate B of FIG. 1B has been eliminated in the structure of FIG. 2J This reduces the area of the logic element on the wafer, which results in a reduction of the die size and associated fabrication costs.

Figure 2K:
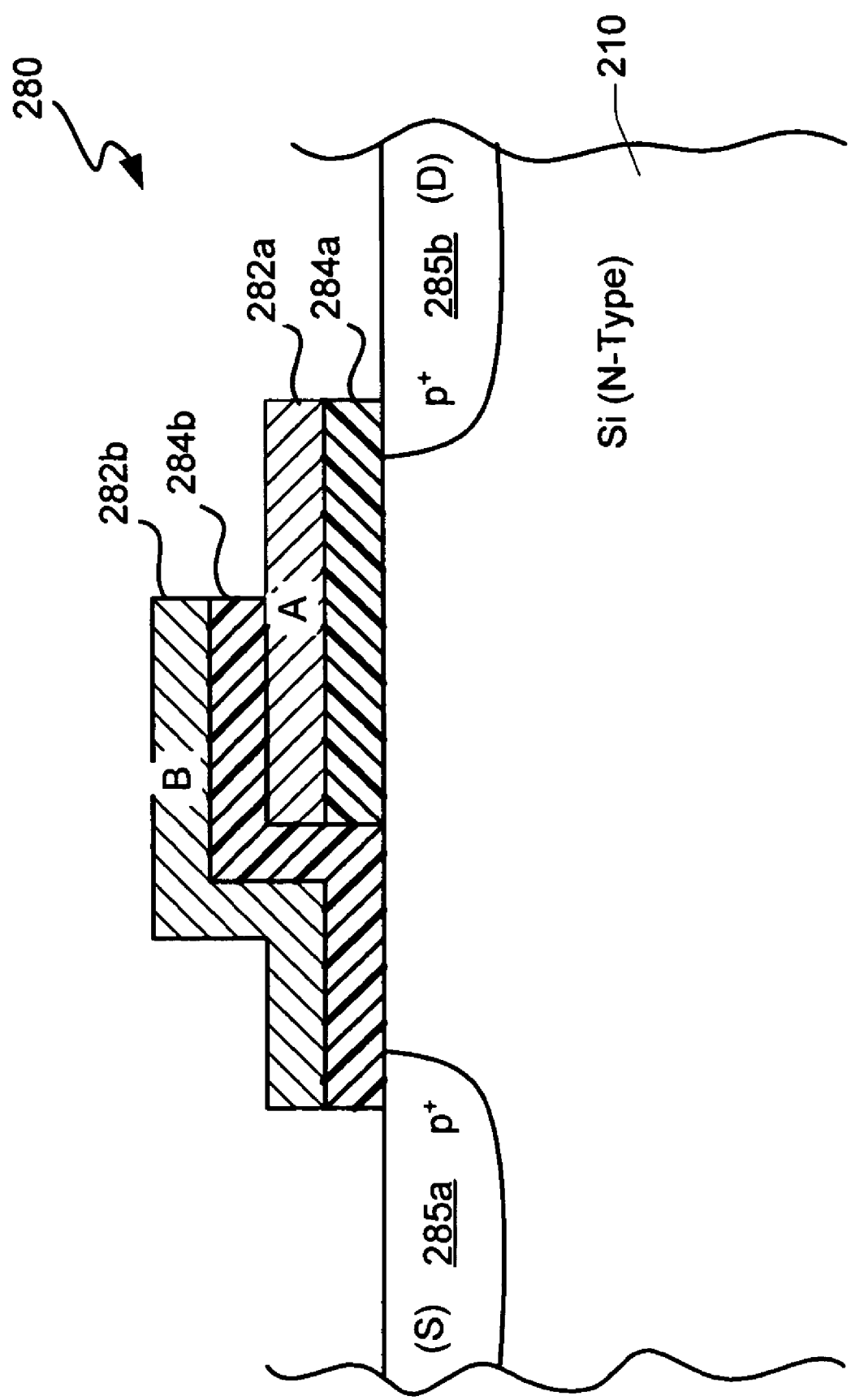
FIG. 2K shows an alternate embodiment of a portion 280 of a logic element which has been fabricated in accordance with a specific embodiment of the present invention.

It will be appreciated that alternate embodiments of the present invention may include features different than those illustrated in the circuit portion 275 of FIG. 2J. For example, FIG. 2K shows an alternate embodiment of a circuit portion 280 which has been fabricated in accordance with a specific embodiment of the present invention. As shown in the embodiment of FIG. 2K, the circuit portion 280 includes two overlapping poly-silicon layers 282a, 282b, which are formed over substrate 210. In this particular embodiment, the substrate 210 is comprised of N-type material, and the (p+) doped regions 285a, 285b are formed of P-type material. One of the notable differences between the circuit portions 275 and 280 is that, the P-well region 208 of circuit portion 275 (FIG. 2J) functions as a local substrate for the transistors of circuit portion 275, whereas circuit portion 280 does not include a separate well region that is distinct from the substrate 210. Rather, in the circuit portion 280 (FIG. 2H), the substrate 210 functions as the local substrate for the transistors of circuit portion 280.

Figure 3D:
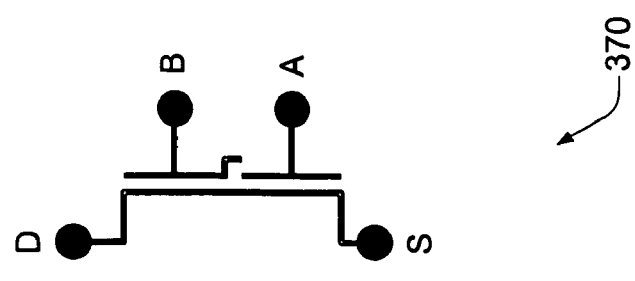

FIGS. 3A-D illustrate different embodiments of a series transistor circuit which may be fabricated in accordance with the techniques of the present invention. FIG. 3A shows a perspective view of the circuit portion 200 of FIG. 2A. FIG. 3B shows a perspective view of an alternate embodiment of a circuit portion 350 which may be used to implement the series transistor circuit 100 of FIG. 1A.

Referring to FIG. 3A, it is noted that the design of circuit portion 300 differs from conventional circuit designs in several aspects. For example, as noted previously, different poly-silicon layers are used to form the transistor gates 202*a*, 202*b*. Additionally, the location and configuration of the gate structures differs from that of conventional circuit designs, such as that illustrated in FIG. 1B. For example, as shown in FIG. 3A, gate 202*b* overlaps a portion of the gate 202*a* in a manner which results in a portion of the gate 202*a* being interposed between gate 202*b* and the active region of the substrate 208. Additionally, unlike the conventional gate configurations of FIG. 1B (which are generally flat), the configuration of gate 202*b* is not flat, but rather is of a stepped configuration which includes portions that extend both horizontally and vertically. As a result, neither the top nor bottom surfaces of gate 202*b* are substantially planar.

It is also noted that the design of circuit portion 300 differs from conventional non-volatile memory structures in several aspects. For example, in conventional non-volatile memory cell structures, two layers of poly-silicon may be used to form a conventional split gate cell which includes a control gate and a floating gate. Conventionally, the floating gate is designed as an electrically isolated region which is used as a storage node to store a charge for a single non-volatile memory cell. It is important for the floating gate to be electrically isolated from all other structures in the memory cell in order to properly store the charge. In contrast, neither of the gate structures 202*a*, 202*b* of FIG. 3A are implemented as electrically isolated regions in a manner similar to the floating gate structure of a non-volatile memory. Rather, the gate structures 202*a*, 202*b* may each be electrically coupled to other portions of the integrated circuit, via one or more contact regions, in order to allow desired gate voltage to be applied to the transistor circuit 300. This is illustrated, for example, in the embodiment of FIG. 3C.

Figure 3C:
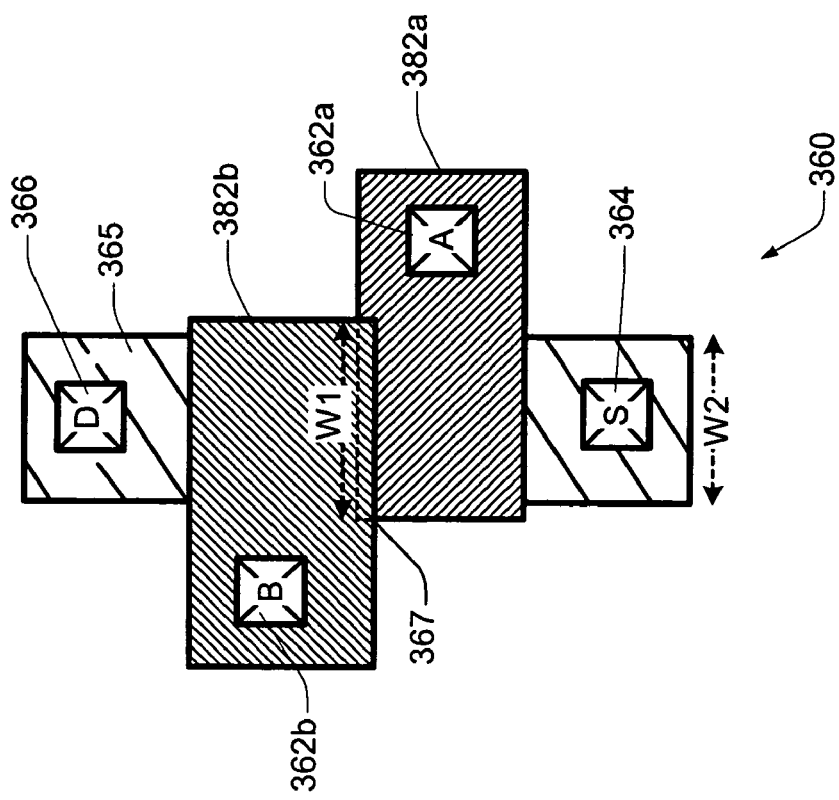

FIG. 3C shows a top view of a circuit layout 360 which has been designed using a specific embodiment of the technique of the present invention. More specifically, the embodiment of FIG. 3C represents a specific implementation of a design layout for series transistor circuit such as that illustrated in FIG. 3A. A conventional schematic illustration of a series transistor circuit is illustrated in FIG. 1A. However, FIG. 3D shows an example of a schematic diagram 370 which may be used to schematically represent the circuit 360 of FIG. 3C.

As shown in FIG. 3C, the series transistor circuit 360 includes two gates 382*a*, 382*b* having overlapping portions over the active region 365. According to a specific embodiment, the circuit 360 may be fabricated using a multiple poly-silicon laying technique of the present invention, wherein a first gate (e.g. 382*a*) is formed with the poly-1 layer, and a second gate (e.g. 382*b*) is formed with the poly-2 layer. A portion of the two gates overlap as shown at region 367. According to a specific embodiment, the width W1 of the gate overlap region 367 is at least equal to or greater than the width W2 of the active region 365. As illustrated in FIG. 3C, each of the gates 382*a*, 382*b* includes a respective contact region 362*a*, 362*b* for providing electrical contact to each of the gates. According to a specific embodiment, the poly-1 and poly-2 layers may be made of poly-silicon or other appropriate conductive material commonly known to one having ordinary skill in the art.

Additionally, as shown in FIG. 3C, the active region 365 may include a source contact region 364 and a drain contact region 366. In the example of FIG. 3C, the gate contact regions 362*a*, 362*b* are placed on opposite sides of the active region 365 in order to ensure that design constraints are met relating to minimum spacing between contact points. However, it will be appreciated that there are a variety of different ways to implement the circuit 360 of FIG. 3C. For example, in an alternate implementation (not shown), the contact points on each of the gates 382*a*, 382*b* may be located on the same side of the active region 365. It will be appreciated, however, that one commonality among each of the different implementations is that portions of the gate 382*a*, 382*b* will overlap or abut each other over the active region 365. It will be appreciated that the circuit portion 300 of FIG. 3A illustrates one type of multi-poly overlay gate structure which may be used in the fabrication of logic elements of an integrated circuit chip. One issue related to the structure of circuit portion 300 is that the variable gate length of gate 202*b* may be subject to misalignment relative to gate 202*a*. One embodiment for resolving the problems of gate misalignment due to variable gate length is illustrated in FIG. 3B of the drawings.

FIG. 3B shows a perspective view of an alternate embodiment of a logic element circuit portion 350 which has been implemented in accordance with a specific embodiment of the present invention. As illustrated in FIG. 3B, the circuit portion 350 includes a first oxide layer 304*a*, a poly-1 gate 302*a*, a second oxide layer 304*b*, and a poly-2 gate 302*b*. As illustrated in FIG. 3B, the poly-2 gate 302*b* is adjacent to both sides of the poly-1 gate 302*a*. In addition, the poly-2 gate 302*b* overlaps the poly-1 gate 302*a* over the active region 308 of the substrate. Thus, as illustrated in FIG. 3B, at least a portion of the gate 302*a* is interposed between gate 302*b* and the active portion 308 of the silicon substrate. Additionally, as shown in FIG. 3B, gate 302*a* is separated from gate 302*b* by a distance which is approximately equal to the thickness of the second oxide layer 304*b*.

One of the advantages of the gate structure configuration of FIG. 3B is that it may reduce or eliminate the variable gate length issue described above with respect to FIG. 3A. For example, according to a specific implementation, the overall width W of gate 302*b* may remain constant since, for example, the width of gate 302*b* is determined by a mask edge which is able to be properly aligned. Accordingly, the gate configuration of FIG. 3B may be used to mitigate misalignment issues between the poly-1 gate 302*a* and the poly-2 gate 302*b*.

It is noted that the circuit portions 300 and 350 are only intended to illustrate the structures over the active regions (e.g., 208, 308) of each circuit, and do not necessarily reflect all of the features of each circuit. Thus, it will be appreciated that the circuit portions 300 and 350 may include other features not illustrated in FIGS. 3A and 3B. For example, one such feature relates to the contact points used for contacting the gate structures 202*a*, 202*b*, 302*a*, 302*b*. Another feature relates to the configuration of the gate structures 202*a*, 202*b*, 302*a*, 302*b*. For example, in one implementation each of the gate structures may be implemented as a line of poly-silicon which may extend in any direction in the X-Z plane. Another feature relates to the addition of other transistors which may be used to build desired logic elements.

It will be appreciated that the technique of the present invention of using multiple layers of poly-silicon to form logic elements provides extra degrees of freedom in fine tuning various transistor parameters such as, for example, oxide thickness, threshold voltage, maximum allowed gate voltage, etc. For example, according to different embodiments, the poly-1 and poly-2 gate oxides may each be fabricated with different thickness in order to fine tune various transistor parameters. According to a specific implementation, two logic transistors of the same size (e.g., width and length) may benefit from having 2 different threshold voltages because their respective gate oxides may be made of 2 different oxide layers. Additionally, it will be appreciated that in conventional MOS transistors, the drain and the source junctions both diffuse laterally under the gate region, thereby reducing the effective gate length and exacerbating short channel effects. However, using the series transistor circuit configurations of the present invention, one junction (with its corresponding lateral diffusion) may be eliminated, for example, for each pair of transistors that are connected in series, thereby improving the short channel effects of the series transistor circuit(s).

Figure 6C:
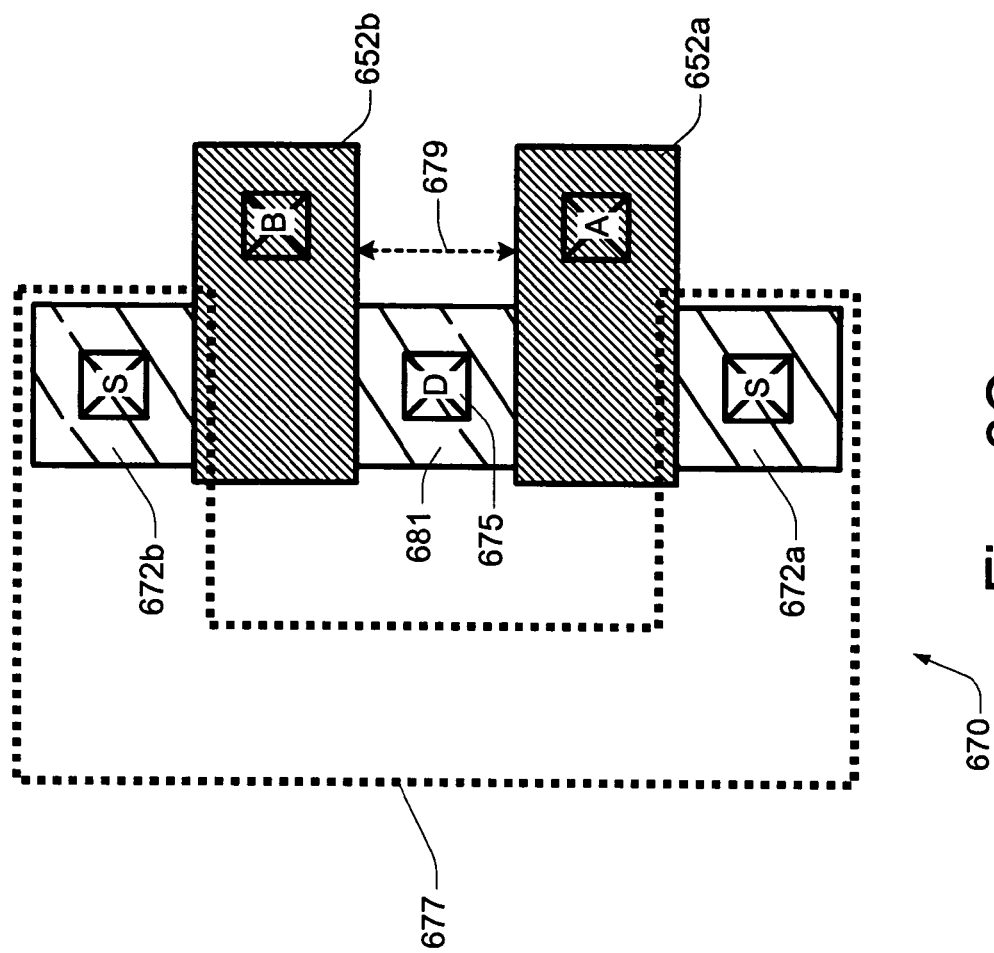
FIGS. 6A-C show examples of conventional integrated circuit design and fabrication techniques for a parallel transistor circuit.
Figure 6A:
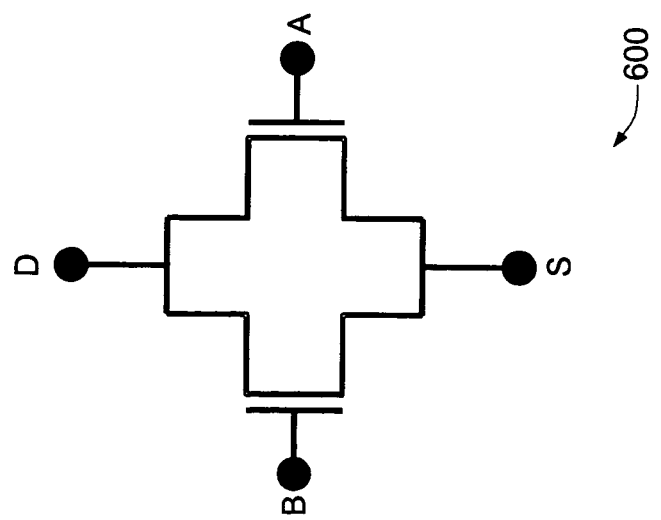

Another common circuit which is used in the design of conventional logic elements is illustrated in FIG. 6A. FIG. 6A shows a circuit portion 600 which includes 2 transistors connected in parallel (herein referred to as parallel transistor circuit 600). A conventional design layout for fabricating the parallel transistor circuit 600 is illustrated in FIG. 6C. As illustrated in FIG. 6C, the conventional parallel transistor circuit layout 670 includes the formation of 2 poly-1 gates 652a, 652b over an active region 681 of the silicon substrate. The gates 652a, 652b are formed using a single poly-silicon layer. According to conventional design rules, the gates are required to be separated from each other by a minimum distance 679. In the embodiment shown in FIG. 6C, the source regions 672a, 672b of the parallel transistor circuit are electrically coupled together via an electrical connection 677.

Figure 6B:
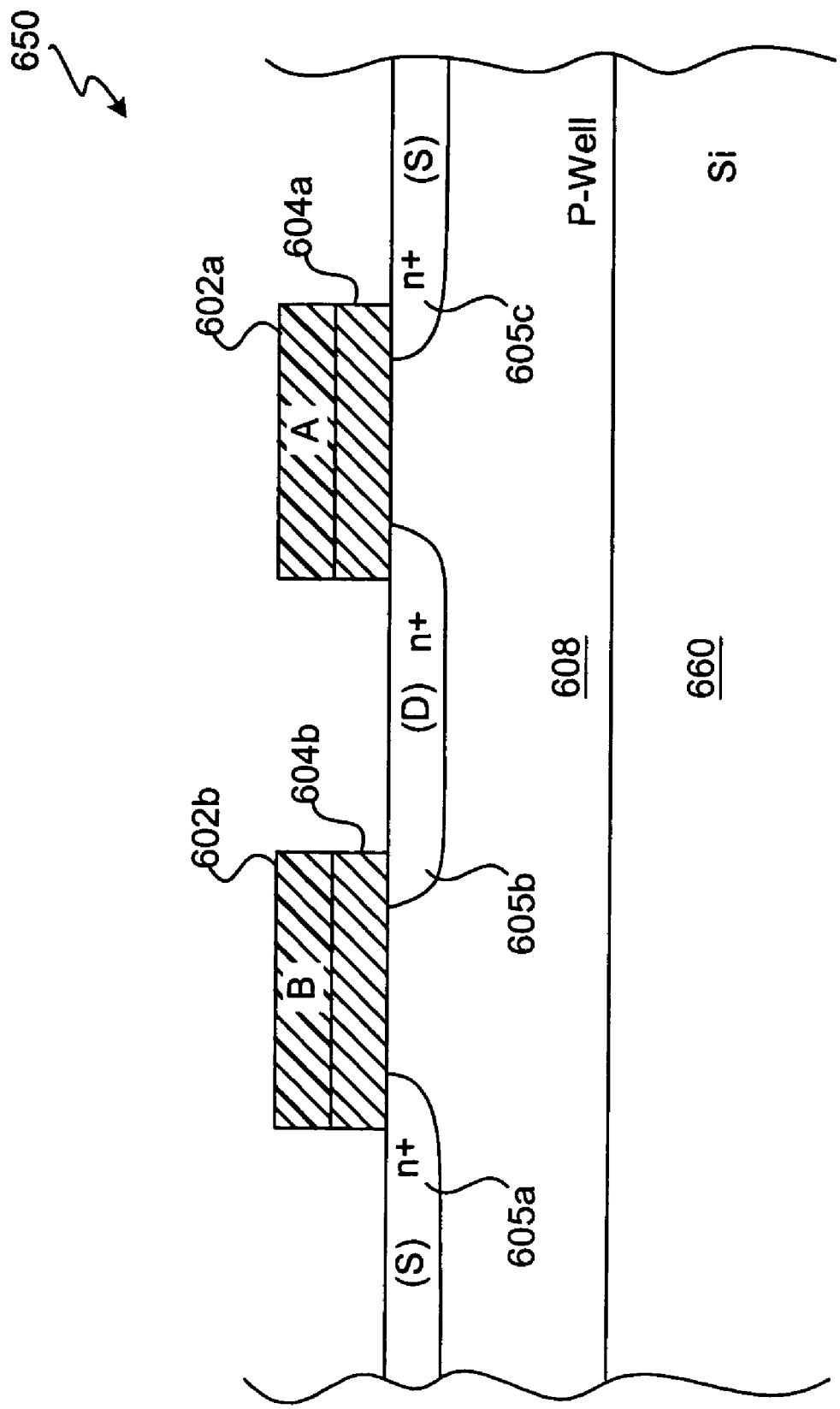

FIG. 6B illustrates a sectional view of a parallel transistor circuit portion 650 which has been fabricated using conventional IC fabrication techniques. The circuit portion 650 illustrated in FIG. 6B has been fabricated using a single poly-silicon layer by employing a technique similar to the technique described previously for fabricating series transistor circuit portion 150 of FIG. 1B. As illustrated in FIG. 6B, circuit portion 650 includes first oxide layer portions 604a, 604b (which are both formed from the same, first oxide layer), poly-1 gate portions 602a, 602b (which are formed from a single poly-silicon layer), and 3 distinct doped regions 605a, 605b, 605c.

Figure 7A:
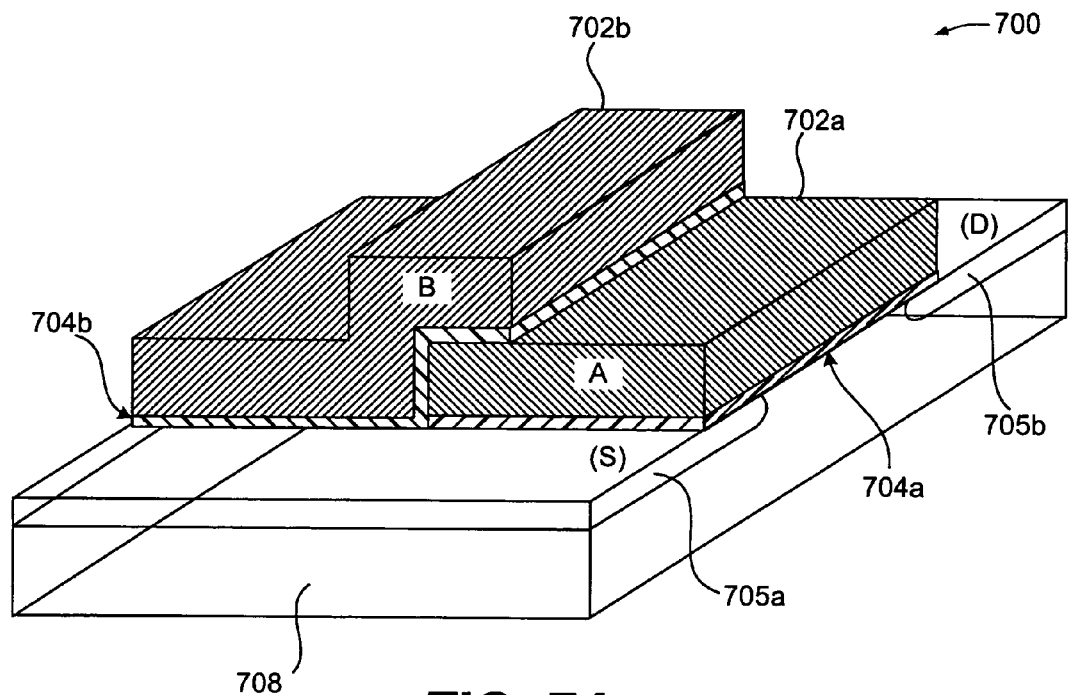
FIGS. 7A-D illustrate different embodiments of a parallel transistor circuit which may be fabricated in accordance with the techniques of the present invention.

FIG. 7A shows a perspective view of a parallel transistor circuit portion 700 which has been fabricated in accordance with a specific embodiment of the present invention. As illustrated in FIG. 7A, the circuit portion 700 includes a first oxide layer portion 704a, a poly-1 gate 702a, a second oxide layer portion 704b, a poly-2 gate 702b, and 2 doped regions 705a, 705b, which may function as the source and drain regions of the parallel transistor circuit. According to a specific implementation, the technique for fabricating the parallel transistor circuit portion 700 of FIG. 7A is similar to the technique described previously with respect to FIGS. 2B-2I of the drawings. Thus, for example, the poly-1 gate 702a may be formed from a first poly-silicon layer, and the poly-2 gate 702b may be formed from a second poly-silicon layer which is different than the first poly-silicon layer. Additionally, oxide layer portion 704a may be formed from a first oxide layer, and oxide layer portion 704b may be formed from a second oxide layer which is different than the first oxide layer.

Figure 7B:
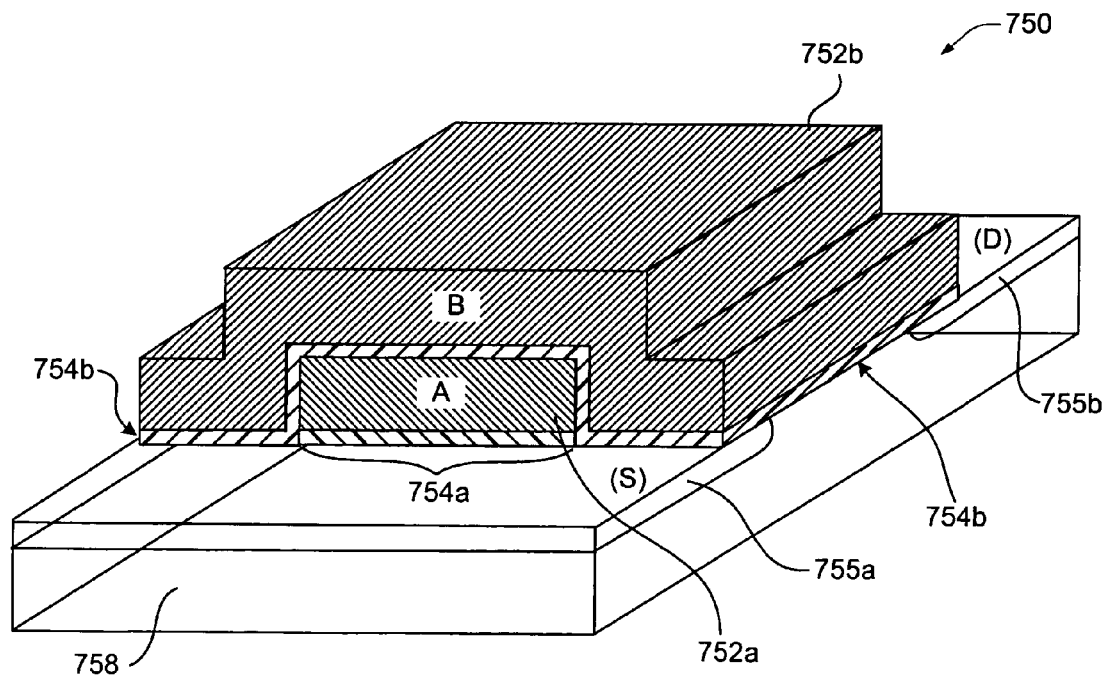
Figure 7D:
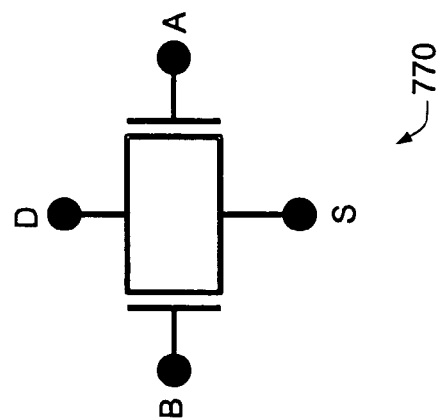
Figure 7C:
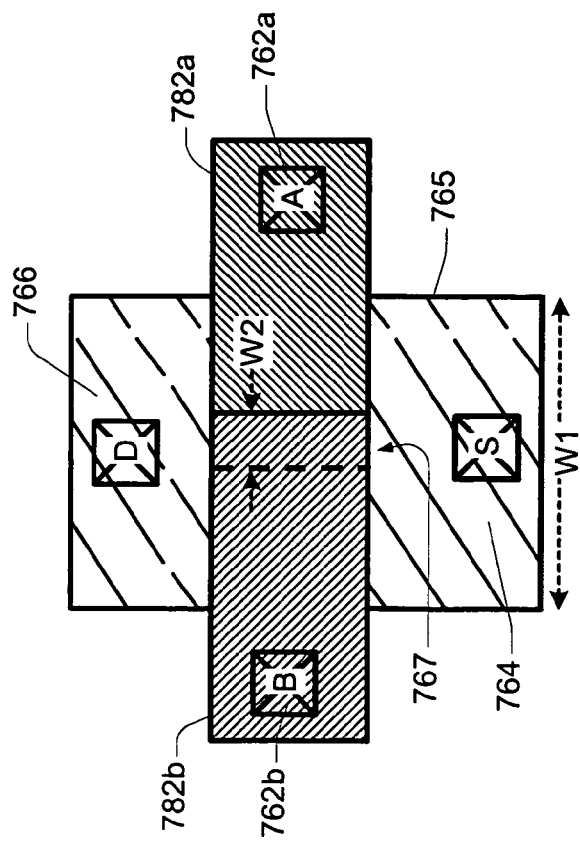

FIG. 7C shows a top view of a design layout 760 which may be used for fabricating a parallel transistor circuit such as that illustrated in FIG. 7A. FIG. 7D shows a schematic diagram 770 which provides a schematic representation of the parallel transistor circuit design 760 of FIG. 7C. As illustrated in FIG. 7C, the parallel transistor circuit design 760 includes a poly-1 gate 782a and a poly-2 gate 782b. Each of the gates 782a, 782b are positioned at least partially over active region 765 between the source and the drain. Each of the gates includes a respective contact region 762a, 762b. A portion of the two gates overlap as shown at region 767. According to a specific embodiment, the width W2 of the gate overlap region 767 is less than the width W1 of the active region 760.

One difference between the parallel transistor circuit design of FIG. 7C and the conventional parallel circuit design of FIG. 6C is that the circuit of FIG. 6C includes two source regions 672a, 672b which are electrically coupled together via an electrical connection 677. In contrast, as illustrated in FIG. 7C, the parallel transistor circuit 760 includes a single source region 764 and a single drain region 766.

FIG. 7B shows a perspective view of an alternate embodiment of a parallel transistor circuit portion 750 which has been fabricated in accordance with the techniques of the present invention. As illustrated in FIG. 7B, the circuit portion 750 includes a first oxide layer portion 754a, a poly-1 gate 752a, a second oxide layer portion 754b, a poly-2 gate 752b, and 2 doped regions 755a, 755b, which may function as the source and drain regions of the parallel transistor circuit. According to a specific implementation, the technique for fabricating the parallel transistor circuit portion 750 of FIG. 7B is similar to the technique described previously with respect to FIGS. 2B-2I of the drawings. Thus, for example, the poly-1 gate 752a may be formed from a first poly-silicon layer, and the poly-2 gate 752b may be formed from a second poly-silicon layer which is different than the first poly-silicon layer. Additionally, oxide layer portion 754a may be formed from a first oxide layer, and oxide layer portion 754b may be formed from a second oxide layer which is different than the first oxide layer.

It is noted that one of the structural differences between the series transistor design of FIG. 3C and the parallel transistor design of FIG. 7C is that, as illustrated in FIG. 3C, either of the gates 382a, 382b has the ability to cut off the flow of current from source 364 to drain 366. As illustrated in FIG. 7C, however, neither of the gates 782a, 782b has complete control over the flow of current from source 764 to drain 766. Rather, each of the gates has control over a portion of the current flow through the active region. Yet, according to the embodiment as illustrated in FIG. 7C, appropriate control voltage is preferably applied to both gates 782a, 782b in order to stop the flow of current from source to drain, for example.

Figure 4:
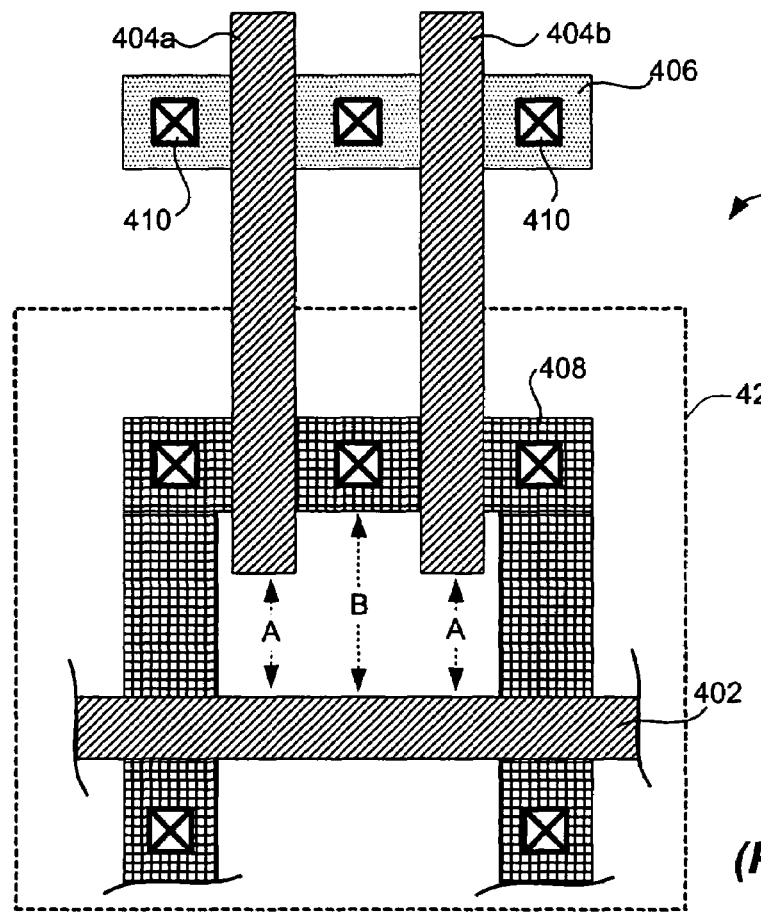
FIG. 4 shows a top view of a conventional design layout for fabricating an SRAM memory cell.

It will be appreciated that the various circuits illustrated in FIGS. 3A-3D and 7A-7D may be used to fabricate a variety of different logic elements which form part of an integrated circuit chip. Such logic elements include NAND gates, AND gates, NOR gates, OR gates, XOR gates, latches, etc. Additionally, such logic elements may include static memory cells such as, SRAM. FIG. 4 shows a top view of a conventional design layout for fabricating an SRAM memory cell 400. Conventionally, SRAM memory cells are fabricated using a standardized design which includes only a single poly-silicon layer. Such a design provides for a relatively less complex and cheaper fabrication process.

Accordingly, as illustrated in FIG. 4, the conventional SRAM cell design includes three poly-1 portions 402, 404a, 404b, each of which are formed from the same poly-silicon layer.

Conventional design constraints require that the various poly-1 portions (e.g. 402, 404a, 404b) be separated from each other by a minimum distance (e.g. distance A) in order, for example, to prevent shorting. Additionally, as shown in FIG. 4, the conventional SRAM cell design includes a P$^+$ doped region 406, and an N$^+$ doped region 408. A portion of the SRAM cell 400 is formed over a P-well 420. In this figure, the various metal interconnections between the regions 406, 408, and 404 are not shown.

The various design constraints associated with conventional SRAM cell fabrication technology require that the various structures of the SRAM cell be designed to have at least a minimum specified amount of spacing from (or overlapping with) other structures within the SRAM cell. For this reason, the size of a conventional SRAM cell may not be reduced smaller than a minimum designated size. For example, if the minimum feature size is 100 nm, the SRAM cell size will typically have an area of at least 1 $\square m^2$. However, using the fabrication technique of the present invention, memory array cell sizes may be reduced by fabricating various transistors using multiple poly-silicon layers. In this way, area reduction of the memory array cell sizes may be achieved by reducing the IC design rules corresponding to minimum poly-1 to poly-1 spacing.

Figure 5:
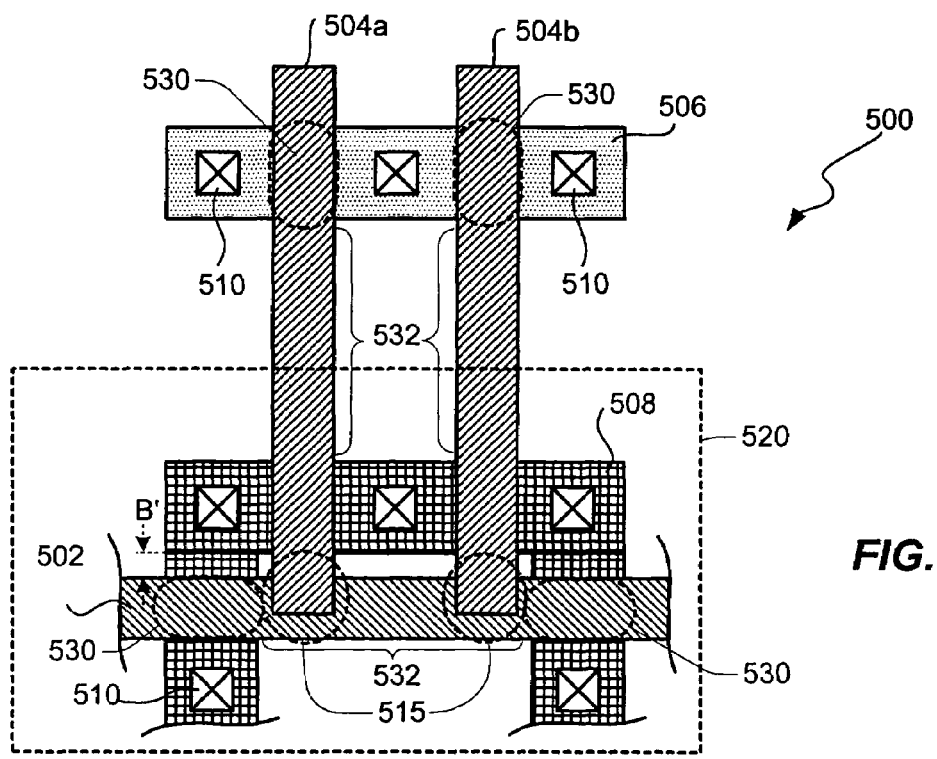
FIG. 5 shows an example of an SRAM memory cell design layout which may be fabricated using the technique of the present invention.

FIG. 5 shows an example of an SRAM memory cell design layout which may be fabricated using the technique of the present invention. As illustrated in FIG. 5, the SRAM cell 500 includes at least one poly-1 layer 502 and multiple poly-2 layers 504a, 504b, which are formed from a different poly-silicon layer than the poly-1 layer 502. Each of the poly-silicon layers 502, 504a, 504b includes a respective gate region 530, and a respective interconnect region 532. According to a specific embodiment, the interconnect regions may correspond to portions of the poly-silicon layers which are formed over passive (or field) regions of the SRAM cell 500. In the embodiment of FIG. 5, a portion of the SRAM cell 500 is formed over a P-well 520. Additionally, in this figure, the various metal interconnections between the regions 506, 508, and 504 are not shown.

According to a specific embodiment, the technique for fabricating the various transistors which are included in the SRAM cell 500 of FIG. 5 may be fabricated using a method which is similar to the transistor fabrication technique described with respect to FIGS. 2B-2I of the drawings. In one of many possible embodiments, a multiple polysilicon layer SRAM cell may be fabricated wherein the transfer gate transistors include gates which are made of a poly-1 layer, and the pull-up and/or pull-down transistors include gates which are made of a poly-2 layer.

As illustrated in FIG. 5, the size of the SRAM cell 500 may be reduced, for example, by overlapping portions of the poly-1 layer 502 with portions of the poly-2 layer 504a, 504b as illustrated at 515. Such a design technique also helps to reduce the spacing between the poly-1 layer 502 and the N$^+$ region 508 as indicated at B'. Additionally, as illustrated in the embodiment of FIG. 5, the overlapping of the poly-silicon regions at 515 occurs at the interconnect regions 532 of the poly-silicon layers (e.g., over the passive regions of the SRAM cell 500).

Although not illustrated in FIG. 5, the SRAM cell design 500 may also include at least two different oxide layers which help insulate the poly-silicon layers from each other and the surrounding structures. For example, the first oxide layer may be located under poly-1 portion 502, and a second oxide layer may be located under the poly-2 layers 504a, 504b, thereby electrically insulating the poly-2 layers from the poly-1 layer.

As with the circuits of FIGS. 3A-D and 7A-D, the use of multiple poly-silicon and oxide layers in the SRAM cell design of FIG. 5 provides extra degrees of freedom in fine tuning transistor parameters such as, for example, oxide thickness, threshold voltage, maximum allowed gate voltage, etc.

Although several preferred embodiments of this invention have been described in detail herein with reference to the accompanying drawings, it is to be understood that the invention is not limited to these precise embodiments, and that various changes and modifications may be effected therein by one skilled in the art without departing from the scope of spirit of the invention as defined in the appended claims. For example, according to specific embodiments, the transistor gate material used to form the logic elements of the present invention may be comprised of conductive materials (e.g, titanium), semiconductive materials (e.g., poly-silicon), or a combination of the two (e.g., titanium silicide). Additionally, the insulating layers (e.g., oxide layer) described in the various embodiments of this application may be comprised of silicon dioxide and/or other types of insulative or dielectric materials.

The invention claimed is:

1. A circuit portion of a logic element, the logic element being part of an integrated circuit, the logic element being operable to perform at least one logic operation, the integrated circuit being fabricated on a substrate, the circuit portion comprising:
   a first doped region formed in the substrate which functions as a source region of the circuit portion;
   a second doped region formed in the substrate which functions as a drain region of the circuit portion;
   an active region formed in the substrate between said source and drain regions, said active region being designed to enable current flow between said source and drain regions;
   a first gate formed over a first portion of the active region, the first gate being adapted to control a first active channel of current flow between the source and drain regions; and
   a second gate formed over a second portion of the active region, the second gate being adapted to control a second active channel of current flow between the source and drain regions;
   wherein the circuit portion adapted to exhibit performance characteristics substantially similar to performance characteristics of at least two transistors connected in parallel.

2. The circuit portion of claim 1 wherein the active region includes the first active channel and second active channel.

3. The circuit portion of claim 1:
   wherein the first gate is positioned adjacent to the second gate; and
   wherein the first gate is electrically isolated from the second gate.

4. The circuit portion of claim 1 wherein the first portion of the active region and the second portion of the active region together correspond to substantially an entirety of the active region.

5. The circuit portion of claim 1 wherein said circuit portion is devoid of third doped region having doping characteristics substantially similar to doping characteristics of the first doped region.

6. The circuit portion of claim 1 wherein said circuit portion is devoid of a floating gate.

7. The circuit portion of claim 1 wherein a first portion of the first gate is formed Over a portion of the second gate, thereby forming a first overlapping gate region.

8. The circuit portion of claim 7 wherein a substantial portion of the first overlapping gate region occurs over the active region.

9. The circuit portion of claim 1 wherein said circuit portion includes a single source region and a single drain region.

10. The circuit portion of claim 1 wherein the circuit portion corresponds to a transistor circuit which includes:
    a source corresponding to the source region;
    a drain corresponding to the drain region;
    a first transistor gate corresponding to the first gate; and
    a second transistor gate corresponding to the second gate;
    wherein the active region includes the first active channel and the second active channel.

11. The circuit portion of claim 10:
    wherein the first transistor gate has associated therewith a first threshold voltage value; and
    wherein the second transistor gate has associated therewith a second threshold voltage value which is different than the first threshold voltage value.

12. The circuit portion of claim 1 wherein the circuit portion corresponds to a transistor circuit which includes:
    a single source corresponding to the source region;
    a single drain corresponding to the drain region;
    a first transistor gate corresponding to the first gate; and
    a second transistor gate corresponding to the second gate;
    wherein the active region includes the first active channel and the second active channel.

13. The circuit portion of claim 1:
    wherein the first gate is fanned having a first thickness;
    wherein the second gate is formed having a second thickness; and
    wherein the first thickness is different than the second thickness.

14. The circuit portion of claim 1, wherein the logic element corresponds to an element selected from a group of: NAND gates, AND gates, NOR gates, OR gates, XOR gates, SRAM cells, and latches.

15. A logic element of an integrated circuit the logic element being operable to perform at least one logic operation, the integrated circuit being fabricated on a substrate, the logic element comprising:
    a first circuit portion adapted to exhibit performance characteristics substantially similar to performance characteristics of at least two transistors connected in parallel;
    wherein the first circuit portion includes:
    a first doped region formed in the substrate which functions as a source region of the first circuit portion;
    a second doped region formed in the substrate which functions as a drain region of the first circuit portion;
    an active region formed in the substrate between said source and drain regions, said active region being adapted to enable current flow between said source and drain regions;
    a first gate formed over a first portion of the active region, the first gate being adapted to control a first active channel of current flow between the source and drain regions; and
    a second gate formed over a second portion of the active region, the second gate being adapted to control a second active channel of current flow between the source and drain regions.

16. The logic element of claim 15, wherein the logic element corresponds to an element selected from a group of: NAND gates, AND gates, NOR gates, OR gates, XOR gates, SRAM cells, and latches.

17. The logic element of claim 15:
    wherein the first gate is positioned adjacent to the second gate; and
    wherein the first gate is electrically isolated from the second gate.

18. The logic element of claim 15 wherein the first portion of the active region and the second portion of the active region together correspond to substantially an entirety of the active region of the first circuit portion.

19. The logic element of claim 15 wherein said first circuit portion is devoid of third doped region having doping characteristics substantially similar to doping characteristics of the first doped region.

20. The logic element of claim 15 wherein said first circuit portion is devoid of third doped region having doping characteristics substantially similar to doping characteristics of the second doped region.

21. The logic element of claim 15 wherein a first portion of the first gate is formed over a portion of the second gate, thereby forming a first overlapping gate region.

22. The logic element of claim 21 wherein a substantial portion of the first overlapping gate region occurs over the active region.

23. The logic element of claim 15 wherein said logic element includes a single source region and a single drain region.

24. The logic element of claim 15 wherein the first circuit portion includes:
    a single source corresponding to the source region;
    a single drain corresponding to the drain region; and
    wherein the active region includes the first active channel and the second active channel.

25. The logic element of claim 15:
    wherein the first logic element gate has associated therewith a first threshold voltage value; and
    wherein the second logic element gate has associated therewith a second threshold voltage value which is different tan the first threshold voltage value.

26. The logic element of claim 15:
    wherein the first gate is formed having a first thickness;
    wherein the second gate is formed having a second thickness; and
    wherein the first thickness is different than the second thickness.

27. The logic element of claim 15 wherein the logic element is adapted to exhibit performance characteristics substantially similar to performance characteristics of an OR logic gate.

28. The logic element of claim 15 wherein the logic element is adapted to exhibit performance characteristics substantially similar to performance characteristics of a NAND logic gate.

29. The logic element of claim 15 wherein the logic element is adapted to exhibit performance characteristics substantially similar to performance characteristics of an inverter.

30. The logic element of claim 15 further comprising:

a second circuit portion adapted to exhibit performance characteristics substantially similar to performance characteristics of at least two transistors connected in series;

wherein the logic element is adapted to exhibit performance characteristics substantially similar to performance characteristics of a NAND logic gate.

31. The logic element of claim 15 further comprising:

a second circuit portion adapted to exhibit performance characteristics substantially similar to performance characteristics of at least two transistors connected in series;

wherein the logic element is adapted to exhibit performance characteristics substantially similar to performance characteristics of a NOR logic gate.

32. The logic element of claim 15 further comprising:

a second circuit portion adapted to exhibit performance characteristics substantially similar to performance characteristics of at least two transistors connected in series;

wherein the logic element is adapted to exhibit performance characteristics substantially similar to performance characteristics of a AND logic gate.

33. The logic element of claim 15 further comprising:

a second circuit portion adapted to exhibit performance characteristics substantially similar to performance characteristics of at least two transistors connected in series;

wherein the logic element is adapted to exhibit performance characteristics substantially similar to performance characteristics of a OR logic gate.

34. The logic element of claim 15 further comprising:

a second circuit portion adapted to exhibit performance characteristics substantially similar to performance characteristics of at least two transistors connected in series;

wherein the logic element is adapted to exhibit performance characteristics substantially similar to performance characteristics of a XOR logic gate.

35. The logic element of claim 15 further comprising:

a second circuit portion adapted to exhibit performance characteristics substantially similar to performance characteristics of at least two transistors connected in series;

wherein the logic element is adapted to exhibit performance characteristics substantially similar to performance characteristics of a latch.

* * * * *